(12) United States Patent
Adams et al.

(10) Patent No.: US 7,352,784 B2
(45) Date of Patent: Apr. 1, 2008

(54) LASER BURST BOOSTING METHOD AND APPARATUS

(75) Inventors: Frank J. Adams, Los Altos, CA (US);
Mark A. Arbore, Los Altos, CA (US);
Werner H. Wiechmann, San Jose, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 388 days.

(21) Appl. No.: 10/896,641

(22) Filed: Jul. 20, 2004

(65) Prior Publication Data
US 2006/0018350 A1    Jan. 26, 2006

(51) Int. Cl.
*H01S 3/04*    (2006.01)
(52) U.S. Cl. .................... 372/34; 372/29.011
(58) Field of Classification Search ............ 372/36, 372/35, 34, 29.02, 29.016
See application file for complete search history.

(56) References Cited

U.S. PATENT DOCUMENTS

| | | | |
|---|---|---|---|
| 3,806,829 A | 4/1974 | Duston et al. | 331/94 |
| 3,962,558 A | 6/1976 | Kocher et al. | 219/121 |
| 4,276,497 A | 6/1981 | Burbeck et al. | 315/209 |
| 4,337,442 A | 6/1982 | Mauck | 372/13 |
| 4,930,901 A | 6/1990 | Johnson et al. | 372/26 |
| 5,151,909 A | 9/1992 | Davenport et al. | 372/22 |
| 5,214,666 A * | 5/1993 | Watanabe et al. | 372/69 |
| 5,291,505 A * | 3/1994 | Nielsen | 372/38.03 |
| 5,293,025 A | 3/1994 | Wang | 219/121 |
| 5,361,275 A | 11/1994 | Opower | 372/22 |
| 5,390,204 A * | 2/1995 | Yessik et al. | 372/38.02 |
| 5,593,606 A | 1/1997 | Owen et al. | 219/121 |

(Continued)

FOREIGN PATENT DOCUMENTS

CA    2461754    4/2003

(Continued)

*Primary Examiner*—Minsun Oh Harvey
*Assistant Examiner*—Tuan N. Nguyen
(74) *Attorney, Agent, or Firm*—Allen, Dyer, Doppelt, Milbrath & Gilchrist, P.A.

(57) ABSTRACT

Methods and apparatus for managing thermal loads on a laser gain medium and for boosting the output power of a diode pumped laser are disclosed. The short-term average pumping power to the gain medium is increased, to provide a burst of pumping energy to the laser gain medium. A subsequent short-term reduction in the average pumping power then allows the gain medium to cool to a desired state steady level. The average pumping power is then increased to maintain this steady state level until the next burst is desired. For example, a pulse of current may be applied to a laser diode at a first current level $I_1$ for a first time interval $\Delta t_1$, where $I_1$ exceeds a nominal current value $I_{nom}$ by an amount $\Delta I_1$. The current to the laser diode is reduced to a second current level $I_2$ for a second time interval $\Delta t_2$, where $I_{nom}$ exceeds $I_2$ by an amount $\Delta I_2$. To balance the thermal load on the diode an integral of $\Delta I_1$ over the time $\Delta t_1$ is approximately equal in magnitude to an integral of $\Delta I_2$ over the time $\Delta t_2$. After applying the pulse of current at the first current level $I_1$, and before or after reducing the current to the second level $I_2$, the nominal current is applied to the laser diode for a third time interval $\Delta t_3$.

28 Claims, 6 Drawing Sheets

U.S. PATENT DOCUMENTS

| | | | |
|---|---|---|---|
| 5,706,302 A * | 1/1998 | Shimizu | 372/36 |
| 5,710,589 A | 1/1998 | Genovese | 347/262 |
| 5,748,654 A | 5/1998 | Marabella et al. | 372/19 |
| 5,751,585 A | 5/1998 | Cutler et al. | 364/474 |
| 5,790,244 A | 8/1998 | Dunne | 356/5.01 |
| 5,822,211 A | 10/1998 | Barenboim et al. | 364/474 |
| 5,832,015 A * | 11/1998 | Goto et al. | 372/34 |
| 5,841,099 A | 11/1998 | Owen et al. | 219/121 |
| 5,847,960 A | 12/1998 | Cutler et al. | 364/474 |
| 5,854,805 A | 12/1998 | Reid et al. | 372/70 |
| 5,943,351 A | 8/1999 | Zhou et al. | 372/22 |
| 5,982,790 A | 11/1999 | Grossman et al. | 372/25 |
| 5,998,759 A | 12/1999 | Smart | 219/121 |
| 6,188,704 B1 * | 2/2001 | Kwon et al. | 372/25 |
| 6,195,113 B1 | 2/2001 | Hoover | 347/235 |
| 6,246,706 B1 | 6/2001 | Kafka et al. | 372/22 |
| 6,259,466 B1 | 7/2001 | Oomura et al. | 347/237 |
| 6,259,714 B1 | 7/2001 | Kinbara | 372/38.02 |
| 6,281,471 B1 | 8/2001 | Smart | 219/121 |
| 6,292,497 B1 | 9/2001 | Nakano | 372/29.015 |
| 6,359,254 B1 | 3/2002 | Brown | 219/121 |
| 6,449,297 B1 | 9/2002 | Takase | 372/38.04 |
| 6,521,866 B1 | 2/2003 | Arai et al. | 219/121 |
| 6,631,153 B2 | 10/2003 | Sumiyoshi et al. | 372/75 |
| 6,683,893 B2 | 1/2004 | Wang | 372/10 |
| 6,781,090 B2 | 8/2004 | Sun et al. | 219/121.71 |
| 6,806,440 B2 | 10/2004 | Sun et al. | 219/121.71 |
| 2001/0029674 A1 | 10/2001 | Cutler | 33/1 |
| 2001/0045419 A1 | 11/2001 | Dunsky et al. | 219/121 |
| 2002/0009110 A1 | 1/2002 | Inoue et al. | 372/38.04 |
| 2002/0009115 A1 | 1/2002 | Sumiyoshi et al. | 372/75 |
| 2002/0125227 A1 | 9/2002 | Sun et al. | 219/121.61 |
| 2002/0185474 A1 | 12/2002 | Dunsky et al. | 219/121 |
| 2003/0047541 A1 | 3/2003 | Sun et al. | 219/121.7 |
| 2003/0168435 A1 | 9/2003 | Steur et al. | 219/121 |
| 2003/0183603 A1 | 10/2003 | Forsman et al. | 219/121 |
| 2003/0185262 A1 | 10/2003 | O'Gorman et al. | 372/45 |

FOREIGN PATENT DOCUMENTS

| | | |
|---|---|---|
| EP | 664591 | 7/1995 |
| GB | 1545933 | 5/1979 |
| WO | 97/45901 | 12/1997 |
| WO | WO03034555 | 4/2003 |

* cited by examiner

LASER BURST BOOSTING METHOD AND APPARATUS

FIELD OF THE INVENTION

This invention generally relates to lasers and more particularly to increasing the power of a laser during pulse-burst operation.

BACKGROUND OF THE INVENTION

Many high-powered laser applications use a laser diode as a source of pump radiation for the gain medium in a laser system. Such laser diodes are semiconductor devices that produce coherent radiation when an electric current passes through the diode. Certain high-powered applications, such as laser drilling, call for delivery of the laser output radiation in bursts of pulses lasting e.g., a few milliseconds or less. During laser pulse bursts, the current to the laser diode may be modulated to boost the current to a high level for a short period time before returning to a low level. The high level of current during the burst provides a high power that, if maintained for too long, would tend to overheat and/or degrade the laser diode and/or the diode-pumped laser performance. Consequently, the pulse period must be sufficiently short and the current must return to a sufficiently low level after the current boost to avoid these problems.

Examples of such pulsing techniques are described, e.g., in U.S. Published patent applications Ser. Nos. 20020125227 and 20030047541 to Sun et al. (hereinafter Sun '541). These applications describe a laser drilling system that uses a diode-pumped, acousto-optic (A-O) Q-switched solid-state UV laser. The timing of diode current pulses is synchronized to movement of the laser beam from one drilling location to the next. The current to the laser diode is reduced while a positioning system moves an output laser beam from one target area to the next target area. The diode current is increased to a higher "super pumping" level beyond the CW-pumped level while drilling. Unfortunately, certain thermal management problems arise in the laser diode when operating a laser system in this fashion.

Thus, there is a need in the art, for a method for boosting laser diode current that overcomes these disadvantages and a system for implement the method.

SUMMARY OF TH INVENTION

Embodiments of the present invention overcome the disadvantages associated with the prior art through methods and apparatus for managing thermal loads on a laser gain medium. A burst of energy is applied to the gain medium. The burst of energy results in heating of the gain medium. The gain medium is then underheated sufficiently to bring a thermal load on the gain medium to a predetermined substantially steady state before applying a subsequent burst of heat to the diode. The thermal condition may be maintained at the substantially steady state until the subsequent burst of heat is applied to the laser diode.

Certain embodiments of the present invention implement thermal management through pulsed operation of a diode-pumped laser involving three levels of diode current. A pulse of current is applied to the diode at a first current level for a first time interval. The first current level exceeds a nominal current value by an amount $\Delta I_1$. The diode current is reduced to a second current level for a second time interval. The nominal current exceeds the second current level by an amount $\Delta I_2$. To balance the thermal load on the laser diode and on the diode-pumped laser gain medium, an integral of $\Delta I_1$ over the time the first interval is approximately equal in magnitude to an integral of $\Delta I_2$ over the second interval. In addition, in a preferred embodiment, the first and second time intervals are similar to or (ideally) less than a maximum time interval that depends on a thermal relaxation time associated with the laser diode. After applying the pulse of current at the first current level, and before or after reducing the current to the second level, the nominal current is applied to the laser diode for a third time interval before applying another pulse of current to the laser diode.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Figure 1:
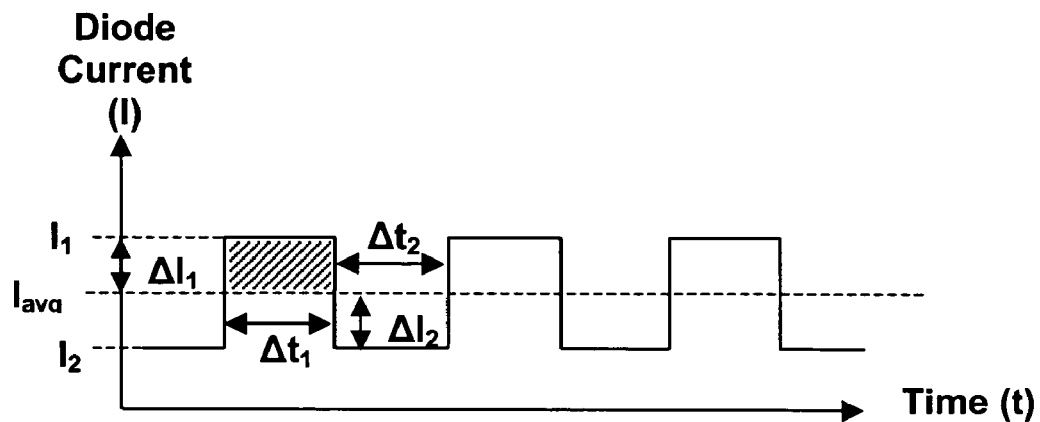
FIG. 1 is a graph of laser diode current versus time illustrating current pulsing according to the prior art.

Although the following detailed description contains many specific details for the purposes of illustration, anyone of ordinary skill in the art will appreciate that many variations and alterations to the following details are within the scope of the invention. In the mathematical derivations described below certain assumptions have been made for the sake of clarity. These assumptions should not be construed as limitations on the invention. Accordingly, the exemplary embodiments of the invention described below are set forth without any loss of generality to, and without imposing limitations upon, the claimed invention.

Glossary:

As used herein:

The article "A", or "An" refers to a quantity of one or more of the item following the article, except where expressly stated otherwise.

Cavity refers to an optical path defined by two or more reflecting surfaces along which light can reciprocate or circulate. Objects that intersect the optical path are said to be within the cavity.

Continuous wave (CW) laser: A laser that emits radiation continuously rather than in short bursts, as in a pulsed laser.

Diode Laser refers to a light-emitting diode designed to use stimulated emission to generate a coherent light output. Diode lasers are also known as laser diodes or semiconductor lasers.

Diode-Pumped Laser refers to a laser having a gain medium that is pumped by a diode laser.

Gain Medium refers to a lasable material as described below with respect to Laser.

Garnet refers to a particular class of oxide crystals, including e.g., yttrium aluminum garnet (YAG), gadolinium gallium garnet (GGG), gadolinium scandium gallium garnet (GSGG), yttrium scandium gallium garnet (YSGG) and the like.

Includes, including, e.g., "such as", "for example", etc., "and the like" may, can, could and other similar qualifiers used in conjunction with an item or list of items in a particular category means that the category contains the item or items listed but is not limited to those items.

Infrared Radiation refers to electromagnetic radiation characterized by a vacuum wavelength between about 700 nanometers (nm) and about 5000 nm.

Laser is an acronym of light amplification by stimulated emission of radiation. A laser is a cavity that is filled with lasable material. This is any material—crystal, glass, liquid, dye or gas—the atoms of which are capable of being excited to a metastable state by pumping e.g., by light or an electric discharge. The light emitted by an atom as it drops back to the ground state and emits light by stimulated emission. The light (referred to herein as stimulated radiation) is continually increased in intensity as it makes multiple round trips through the cavity. A laser may be constructed using an optical fiber as the gain medium. Fibers are typically glass-type materials, though may be crystalline or glass-nanocrystal composites.

Light: As used herein, the term "light" generally refers to electromagnetic radiation in a range of frequencies running from infrared through the ultraviolet, roughly corresponding to a range of vacuum wavelengths from about 1 nanometer ($10^{-9}$ meters) to about 100 microns.

Mode-Locked Laser refers to a laser that functions by controlling the relative phase (sometimes through modulation with respect to time) of each mode internally to give rise selectively to energy bursts of high peak power and short duration, e.g., in the picosecond ($10^{-12}$ second) domain.

Non-linear effect refers to a class of optical phenomena that can typically be viewed only with nearly monochromatic, directional beams of light, such as those produced by a laser. Harmonic generation (e.g., second-, third-, and fourth-harmonic generation), optical parametric oscillation, sum-frequency generation, difference-frequency generation, optical parametric amplification, and the stimulated Raman effect are examples.

Non-linear material refers to materials that possess a non-zero nonlinear dielectric response to optical radiation that can give rise to non-linear effects. Examples of non-linear materials include crystals of lithium niobate ($LiNbO_3$), lithium triborate (LBO), beta-barium borate (BBO), Cesium Lithium Borate (CLBO), KDP and its isomorphs, $LiIO_3$ crystals, as well as quasi-phase-matched materials.

Phase-matching refers to the technique used in a multi-wave nonlinear optical process to enhance the distance over which the coherent transfer of energy between the waves is possible. For example, a three-wave process is said to be phase-matched when $k_1+k_2=k_3$, where $k_i$ is the wave vector of the $i^{th}$ wave participating in the process. In frequency doubling, e.g., the process is most efficient when the fundamental and the second harmonic phase velocities are matched.

Q refers to the figure of merit of a resonator (cavity), defined as $(2\pi)\times$(average energy stored in the resonator)/(energy dissipated per cycle). The higher the reflectivity of the surfaces of an optical resonator and the lower the absorption losses, the higher the Q and the less energy loss from the desired mode.

Q-switch refers to a device used to rapidly change the Q of an optical resonator.

Q-switched Laser refers to a laser that uses a Q-switch in the laser cavity to prevent lasing action until a high level of inversion (optical gain and energy storage) is achieved in the lasing medium. When the switch rapidly increases the Q of the cavity, e.g., with acousto-optic or electrooptic modulators or saturable absorbers, a giant pulse of laser output is generated.

Quasi-Phasematched (QPM) Material: In a quasi-phasematched material, the fundamental and higher harmonic radiation are not phasematched, but a QPM grating compensates. In a QPM material, the fundamental and higher harmonic can have identical polarizations, often improving efficiency. Examples of quasi-phasematched materials include periodically-poled lithium tantalate, periodically-poled lithium niobate (PPLN) or PPKTP.

Vacuum Wavelength: The wavelength of electromagnetic radiation is generally a function of the medium in which the wave travels. The vacuum wavelength is the wavelength that electromagnetic radiation of a given frequency would have if the radiation were propagating through a vacuum and is given by the speed of light in vacuum divided by the frequency.

Theoretical

In describing embodiments of the present invention, it is important to understand how a laser diode responds to an abruptly increased current. Almost immediately (e.g., faster than about one microsecond), the optical output power of the diode rises in proportion to the increase in current. However, the thermal load also increases abruptly, resulting in a temperature rise in the active region of the device. At first, the temperature rise appears linear with time. However, as the duration of the current burst approaches the thermal time constant of the laser diode (about 10 msec in many cases), the temperature rise begins to saturate as the additional heat is conducted away through the laser diode package. After many thermal time constants have elapsed, the laser diode active region reaches a steady-state temperature rise (relative to the temperature it had previously been at before the current was increased), and does not increase further, even if the increased current is maintained for an indefinitely long period of time. An analogous behavior with decreasing temperature occurs due to an abrupt decrease in current. The magnitude of the thermal excursion is proportional to the increase in diode current, both in its initial slope and in its steady-state temperature rise. For time intervals significantly longer than the thermal time constant of the laser diode, the steady-state thermal excursion, of course, does not depend on the time interval. On the other hand, for time intervals significantly shorter than the thermal time constant of the laser diode, the steady-state thermal excursion is proportional to the time interval. For intermediate time intervals (comparable to the thermal time constant of the laser diode), the relationship is more complicated.

There are two primary effects of the temperature rise/fall associated with modulating diode current. First, the diode wavelength shifts longer/shorter, in a linear fashion, with respect to diode temperature. Second, repeated cycles of temperature rise/fall cause thermo-mechanical stresses in the laser diode package, which ultimately can lead to device degradation and/or failure. It is desirable to avoid, minimize, or at least substantially reduce, both of these effects.

When operating in the regime with time intervals longer than the thermal time constant of the laser diode, it is desirable to limit the diode current increase/decrease to such a value as to result in acceptable thermal excursions. Limiting the time interval has little or no effect, until the time interval is decreased to the thermal time constant of the laser diode or below.

When operating in the regime with time intervals similar to or shorter than the thermal time constant of the laser diode, it is also desirable to limit the diode current increase/decrease to such a value as to result in acceptable thermal excursions. However, it is also desirable to limit the time period to such a value as to result in acceptable thermal excursions. When operating in the regime with time intervals much shorter than the thermal time constant of the laser diode, the thermal excursion is proportional to the time interval. Hence, in this case, the thermal excursion is proportional to the product of the time interval and the current increase/decrease. Therefore, it is preferable to limit the product of these parameters, as opposed to individually restricting these parameters.

The inventors have determined that pulsing a laser diode at two levels as described above does not take into account the problem associated with thermal management in the laser diode. These problems are illustrated by the graph of FIG. 1, which depicts current pulsing according to the prior art. The graph shows the pulsing of the diode current by increasing the diode current to a first level $I_1$ during a first time interval $\Delta t_1$ and decreasing the current to a lower level $I_2$ during a second time interval $\Delta t_2$. Over the course of a given pulse cycle ($\Delta t_1 + \Delta t_2$) the average diode current the average current to the diode lies at some average level $I_{avg}$ between $I_1$ and $I_2$. For the sake of example, if the time intervals $\Delta t_1$ and $\Delta t_2$ are the same the average level will lie about halfway between $I_1$ and $I_2$. If $\Delta t_1$ and $\Delta t_2$ are sufficiently short, e.g., less than a thermal relaxation time for the laser diode, the thermal load on the laser diode will depend on the average level $I_{avg}$ and not on the first level $I_1$. Such pulsed operation allows operation of the diode at peak current levels that, if sustained for a long period of time, would give rise to detrimental thermal loads.

Although diode current pulsing of the type shown in FIG. 1 works well when the pulses are regularly repeated, certain problems arise when long periods of time lapse between current pulses. In laser drilling applications, for example, long periods of time $\Delta t_2$ may lapse between application of a pulse (or train of pulses) and the beginning of the next pulse as the laser or a workpiece moves to align the laser for drilling a new hole. During the second time interval $\Delta t_2$ the laser diode tends to cool down as a result of the reduced thermal load. If $\Delta t_2$ becomes too long, the laser diode may cool too much. However it is often desirable to operate a laser diode at a temperature that is neither too high nor to low. One reason is maintenance of the diode wavelength, which is required to efficiently pump many types of solid-state laser gain media. (Diode wavelength depends strongly on diode temperature.) Consequently, excessive cooling of the laser diode between pulses may be just as detrimental as excessive heating.

Another aspect of this issue is that the required burst ($\Delta t_1$) and inter-burst ($\Delta t_2$) times may not be known, or may not be knowable a priori. Hence, while $I_1$ is knowable, the thermally compensating $I_2$ is, in general, not knowable.

Thermal Load Management

According to embodiments of the present invention, thermal loads on a laser may be managed as follows. A burst of energy is applied to the laser gain medium. This burst of energy results in heating of the gain medium. The burst of energy may result from a burst of pumping energy, from one or more sources such as, one or more laser diodes, arc lamps, lasers or electrical pumping sources. Although it is not the only source of heat, the pumping energy is a major source of heat and often the most significant source of heat. The pumping power, i.e., the rate at which pumping energy is supplied to the gain medium, may be increased above some nominal level to boost an optical output from the gain medium. By way of example, the gain medium may be pumped by one or more laser diodes and the burst of pumping energy may be supplied by pulsing the current to the diodes. Alternatively, in a laser pumped by multiple sources of pumping energy, a first subset of the sources may be operated continuously while a second subset remains idle. The burst of pumping energy may be applied by temporarily turning on the sources in the second set. For example, if four diodes are used to pump the gain medium, three of them may be turned on during normal operation. When a burst of laser output is desired, the fourth diode may be turned on, thereby applying the burst of heat.

To balance the thermal load, the laser gain medium is then underheated sufficiently to bring the thermal load on the gain medium to a predetermined substantially steady state before applying a subsequent burst of heat. The term "underheating", as used herein refers to reducing the flow of heat into the gain medium sufficiently that it cools. The gain medium cools when the rate at which heat transfers out of the gain medium exceeds the rate at heat enters the gain medium. There are often a number of mechanisms by which heat may leave the gain medium, e.g., convection, conduction and radiation. Typically, the primary cooling mechanism is conduction to a heat sink. Often the heat sink is passive (i.e., characterized by a constant degree C per watt). Alternatively the gain medium may be cooled with an active heat sink (e.g., one having a time variable temperature or heat capacity). Consequently, the laser gain medium may be underheated by reducing the pumping power applied to the gain medium sufficiently that the cooling mechanisms dominate the net flow of heat. For a diode pumped laser, the pumping power may be reduced by sufficiently reducing the diode current. For a laser pumped by multiple sources of pumping energy, the gain medium may be cooled by turning off one or more of the sources so that the gain medium cools. For example if four diodes pump the gain medium to boost the power, two of the four diodes may be turned off to cool the gain medium.

The thermal load may be maintained at the substantially steady state until a subsequent burst of energy is applied to the laser gain medium. The gain medium may be said to reach a substantially steady thermal state when the flow of heat into the gain medium approximately balances the flow of heat out of the gain medium. A temperature, temperature gradient, temperature profile or other thermal property of the laser gain medium may be used to characterize the substantially steady state condition. The term "substantially steady state" is used in recognition of the fact that while a truly constant thermal state may be ideal, it is often unrealistic due to thermal fluctuations and/or drift. The size of such fluctuations or drift is dependent on many factors, including the laser diode used and the desired laser application. The term "substantially steady state", as used herein, means that the thermal load remains within acceptable levels of fluctuation and/or drift.

By way of example, the thermal load may be maintained at a substantially steady state by applying a nominal amount of pumping power to the laser gain medium. In a diode pumped laser, this can be done by applying a nominal level of current to one or more of the diodes pumping the gain medium. For a laser pumped by multiple sources of pumping energy, the thermal load on the gain medium may be maintained at a substantially steady state by turning on a sufficient number of the sources so that the heating and cooling mechanisms substantially balance out. Returning to the four-diode example, three of the four diodes may be turned on to maintain the substantially steady state.

Please note that a laser diode includes a semiconductor gain medium pumped by a diode current. The diode current contributes to heating of the laser diode. Thus, in a diode-pumped laser, there may be thermal load issues with respect to both the laser diode and the gain medium the diode is pumping. Appropriate application of the diode current can be used to manage both types of thermal loads. Appropriate application of the diode current may also be used to manage thermal loads in laser diodes used in applications other than providing pumping radiation to a laser gain medium.

There are many possible variations on the examples described above. However these variations have common features. Specifically, to boost the short-term average pumping power applied to the laser gain medium one must subsequently operate below a steady state power in order to have a correct long-term average power that is independent of the burst pattern. For example, the desired pattern of heating and underheating may be obtained by rapid pulse modulation, where the pumping power and/or diode current level are pulsed and the desired pumping power levels are obtained by adjusting a duty cycle of the pulsing. Such modulation is sometimes referred to as pulse width modulation (PWM). Other embodiments include optimized heating waveforms for minimum transient effects and alternate means of varying the short term average power delivered to the gain medium. The pumping power and/or diode current may be switched between discrete levels or varied in a continuous fashion to obtained the desired pattern of heating and cooling. Furthermore, the pumping power may modulated, e.g., by acousto-optic or electro-optic modulation of radiation from a laser diode, while the diode current remains more or less constant.

Three Level Pulsed Diode Operation

As described above, pulsed operation of lasers pumped by one or more diodes can lead to thermal management problems in the laser gain medium and/or diodes. To overcome the problems associated with cooling of the gain medium and laser diode during long intervals between bursts of diode current, the inventors have developed a method and apparatus for pulsed operation of a laser diode that uses three current levels. Although the following discussion is in terms of a gain medium pumped by a single diode, the principle of operation can be applied to lasers pumped by more than one diode.

Figure 2:
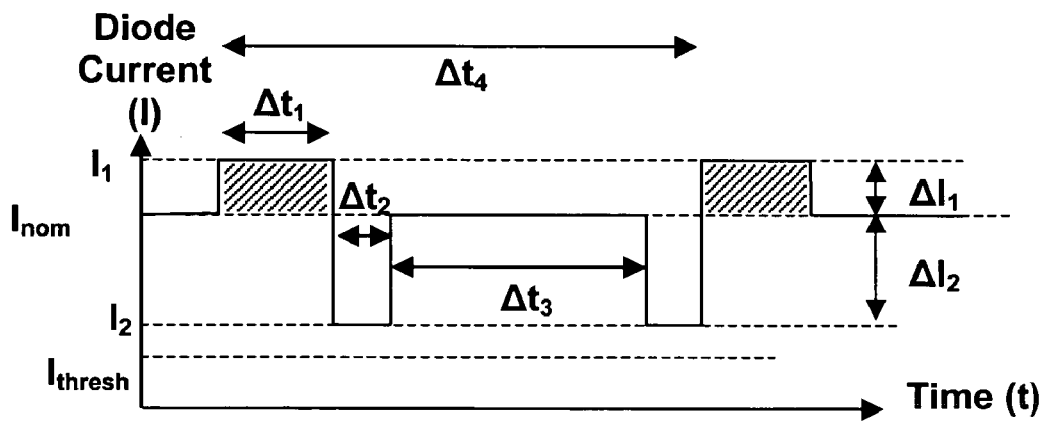
FIG. 2 is a graph of laser diode current versus time illustrating current pulsing according to an embodiment of the present invention.

The graph of FIG. 2 illustrates the principal of operation behind certain embodiments of the invention. In FIG. 2, laser diode current is plotted as a function of time. In between current pulses a nominal level of current $I_{nom}$ is applied to the laser diode. In this simplest embodiment, $I_{nom}$ is the current which gives the desired (or optimal) steady-state diode and diode-pumped laser parameters. Typically, the relevant parameters include diode wavelength (which depends on diode temperature), diode lifetime (which depends on diode temperature and current), and gain medium thermal lens (which depends on diode wavelength and diode power, which in turn, depends on diode current.)

When a boost in output from the laser diode is desired, the diode current rises by an amount $\Delta I_1$ above $I_{nom}$ to a first level $I_1$ for a burst period $\Delta t_1$. To balance the thermal load on the diode, the current reduces below $I_{nom}$ by an amount $\Delta I_2$ to a second level $I_2$ for a reduction interval $\Delta t_2$. (Generally, the laser is not generating significant output during this time period.) During a third interval $\Delta t_3$ between pulses, the nominal current $I_{nom}$ is applied. This prevents the laser diode from cooling down during long intervals between pulses and maintains the thermal load on the diode in a desired range. This type of three-level operation addresses the thermal management issues that arise from two-level pulsed operation of the type described, e.g., by Sun et al. Furthermore, with the type of three-level operation described herein, thermal loads on the laser diode and gain medium can be substantially independent of the duty cycle for the pulsed operation as defined, e.g., by the ratio of the burst period $\Delta t_1$ to the sum of the burst period $\Delta t_1$, reduction interval $\Delta t_2$ and third interval $\Delta t_3$.

Diode pumped lasers have been operated with an increase in diode current followed by a decrease in current (see, e.g., U.S. Published patent application 2002/000911 to Sumiyoshi et al.) to reduce transients in the resulting pulses of fundamental radiation from a diode pumped gain laser crystal. However, such operation involved either increasing the diode current in a step-wise fashion from an initial value to a plateau value or increasing the current to some peak value and then decreasing the current below the peak value before raising the current to the plateau value at or above the peak value. The current is held at the plateau value before it is reduced to the initial value. For such diode current waveforms, the thermal loads on the diode and laser crystal can depend strongly on the duty cycle of the waveform.

In embodiments of the present invention, by contrast, the thermal loads on a laser diode and gain medium can be substantially independent of the duty cycle. By proper choice of $\Delta I_1$, $\Delta I_2$, $\Delta t_1$ and $\Delta t_2$, the average current to the diode over the pulse interval $\Delta t_1 + \Delta t_2$ may be made roughly equal to the nominal current $I_{nom}$ In a particular embodiment this may be accomplished if the integral of $\Delta I_1$ over the first time interval $\Delta t_1$ is approximately equal in magnitude to the integral of $\Delta I_2$ over the second time interval $\Delta t_2$. By way of example, if $\Delta I_1$ and $\Delta I_2$ are approximately constant over their respective time intervals, this requirement reduces to:

$$\Delta I_1 \Delta t_1 = \Delta I_2 \Delta t_2 \qquad \text{Equation 1:}$$

Generally speaking, the boost level $\Delta I_1$ may be varied as desired, e.g., to provide a desired level of pumping to a laser gain medium pumped by the laser diode. However, as a practical matter, there are at least three restrictions on the values of $\Delta I_1$, $\Delta t_1$, $\Delta I_2$ and $\Delta t_2$. Specifically, it is desirable to restrict the thermal excursion of the diode to within safe limits. It is also desirable to restrict the boost level $\Delta I_1$ to one for which there is no optical damage to the laser diode or to the diode-pumped laser. In addition, it is desirable to keep the diode above the threshold current for lasing ($I_{thresh}$) during all three intervals $\Delta t_1$, $\Delta t_2$ and $\Delta t_3$.

To keep the thermal excursion within safe limits and avoid optical damage there will be some maximum current $I_1^{max}$. Keeping the diode current above threshold generally means that the value of $I_2 = I_{nom} - \Delta I_2 > I_{thresh}$. Limiting the thermal excursions of the diode depends partly on the thermal properties of the diode. For example, there is a thermal relaxation time associated with heating and cooling the diode and other laser components (such as the diode-pumped laser gain medium) that must also be taken into account when determining both $\Delta t_1$ and $\Delta t_2$ for a given desired/requested value of boost current $\Delta I_{req}$. (For many high-power laser diodes suitable for diode-pumping solid-state lasers, this thermal relaxation time is about 10 msec.) Even if the boost level is below $I_1^{max}$, the thermal excursion of the diode may be unsafe if $\Delta t_1$ is too great. Thus, to limit thermal excursions, as the requested boost current of $\Delta I_1^{req}$ increases $\Delta t_1$ proportionally decreases to keep the thermal excursion at a safe level.

Furthermore a limit may be placed on the maximum value of the burst period $\Delta t_1^{max}$, which depends partly on thermal constraints on the laser diode. In addition to the thermal constraints, additional criteria for setting $\Delta t_1^{max}$ may include, e.g., the time it takes to reach steady-state on the thermal lens in a laser gain medium (e.g., Nd:YAG or other) that is pumped by the laser diode. Depending on the gain medium and other factors, this number may be roughly 50 msec (depends on the size of the pumped region i.e. beam). Preferably, $\Delta t_1^{max}$ is much less than this thermal lens formation time, as the laser's efficiency at converting diode power to useful output power changes as the thermal lens changes. Also, the beam profile usually changes. To a lesser extent, the value of $\Delta t_1^{max}$ may depend on the cooling geometry.

Since $\Delta I_1$ may vary over the burst interval, it may be more practical to express the thermal constraints on $\Delta I_1$, $\Delta t_1$, $\Delta I_2$ and $\Delta t_2$ in terms of an integral of $\Delta I_1$ over the burst interval. One possible way of determining this limit is described below.

1) First, establish allowable thermal excursion that results in an acceptable diode lifetime (such as >10 million bursts). The result may be several degrees Celsius. Lifetesting with modulated diode current is the most reliable means to establish this criterion.
2) Next, establish the thermal time constant that applies to the diode. Again, this is most accurately done experimentally. The diode wavelength can be used as a fast means of measuring diode temperature. The time required for diode wavelength to reach steady state is the same as the time it takes for the diode temperature to reach steady state. The answer for many laser diodes is about 10 msec. There may be many thermal relaxation times associated with the diode. However, the one thermal relaxation time constant that is most relevant to embodiments of the present invention is the shortest relaxation time, which happens to be associated with the region of the diode package nearest to the semiconductor material of the diode itself. This time constant is typically about 10 msec for most high-power diode laser devices. The thermal relaxation time is a device property that is meaningful in contexts other than embodiments this invention. The shortest thermal relaxation time generally does not depend on the burst pattern requested by the user, or the burst boost level.
3) Next, establish the relationship between steady-state temperature rise and incremental diode current. Again, this is most accurately done experimentally.
4) Finally, mathematically model the diode temperature rise as a function of $\Delta I_1$ and $\Delta t_1$, as well as $\Delta I_2$ and $\Delta t_2$, then compare with the result of step 1). Modeling can be done by assuming a single exponential approach to steady-state. From the resulting mathematical model one can estimate for a given value of $\Delta I_1$ a value of $\Delta t_1$ that gives an unacceptable rise in diode temperature as determined in step 1. This process can be used to determine a boundary to a range of allowed combinations of values of $\Delta I_1$ and $\Delta t_1$. This range may have a somewhat arbitrary maximum value $\Delta t_1^{max}$ for $\Delta t_1$.

By way of example, and without loss of generality, a range of allowable values of $\Delta I_1$, $\Delta t_1$, $\Delta I_2$, $\Delta t_2$ may be determined with sufficient information about the thermal properties of the laser diode. Equation 1, expresses the constraint that the thermal load on the diode is balanced when averaged over many bursts. To calculate the thermal excursion of the laser diode it may be assumed that the diode is at thermal equilibrium with the current at $I_{nom}$, then a burst occurs, then current reduction, then an optional return to $I_{nom}$ before another burst occurs. The temperature rise at the end of the burst may be given by:

$$\Delta T_1 = K \Delta I_1 [1 - \exp(-\Delta t_1/t_{thermal})], \quad \text{Equation 2:}$$

where $t_{thermal}$ is the thermal (exponential) time constant of the laser diode package and K is a constant that relates the steady-state temperature rise to change in diode current (units are, e.g., °C./Amp). The values of $t_{thermal}$ and K may be determined experimentally. The temperature rise at the end of the current reduction period is given by:

$$\Delta T_2 = -K \Delta I_2 [1 - \exp(-\Delta t_2/t_{thermal})]. \quad \text{Equation 3:}$$

Diode degradation is typically driven by thermal excursions of the diode package. Therefore, a useful metric is the total thermal excursion experienced by the diode. That is given by the difference:

$$\Delta T_1 - \Delta T_2 = K \Delta I_1 [1 + (\Delta I_2/\Delta I_1) - \exp(-\Delta t_1/t_{thermal}) - (\Delta I_2/\Delta I_1)\exp(-\Delta t_2/t_{thermal})]. \quad \text{Equation 4:}$$

Next, it is desirable to establish a limit for tolerable thermal excursions. This may be done experimentally using diode lifetesting. Since it is not necessarily true that the diode degradation rate will behave in a predictable (i.e. linear) manner as a function of thermal excursion, it is desirable to do testing with parameters similar to the regime of interest—particularly the thermal excursion of interest. In order to determine the answer as quickly as possible, it is advantageous to drive diodes at as high a modulation frequency (i.e. short burst on and off times) as is practical, without violating the constraints above (i.e. do not cause optical damage or go below threshold). Burst on and off times comparable with $t_{thermal}$ are generally a good choice. (With shorter bursts, it is difficult to achieve substantial thermal excursions for testing, without violating the constraints on current.)

Once a lifetest indicating tolerable (and, ideally, measurable) diode degradation rate is completed, the values of $\Delta I_1$, $\Delta I_2$, $\Delta t_1$, $\Delta t_2$ used for the lifetest can be inserted into equation (4) to determine a tolerable thermal excursion, $\Delta T_{tolerable}$. To determine allowed vs. non-allowed values of the parameters of $\Delta I_1$, $\Delta I_2$, $\Delta t_1$, and $\Delta t_2$, they must satisfy Equation 1, and also:

$$\Delta T_1 - \Delta T_2 \leq \Delta T_{tolerable}. \quad \text{Equation 5:}$$

Note that the constant "K" dropped out of the calculation. Also note that there are four variables and only one equality constraint. Hence, there is still freedom to select a pair of $\Delta I_2$ and $\Delta t_2$ values for any given user-specified pair of $\Delta I_1$ and $\Delta t_1$ values (subject to the inequality in Equation 5).

In general, it is usually less thermally stressful to the diode to select small $\Delta I_2$ and large $\Delta t_2$ values. However, this is more restrictive on the application (user), in that it limits the duty cycle of operation of the laser. Therefore, it is generally advantageous to select large $\Delta I_2$ and small $\Delta t_2$ values, thereby slightly limiting the range of allowable $\Delta I_1$ and $\Delta t_1$ values.

Equation 4 can be further simplified if the value $\Delta I_2$ is fixed (as in a preferred embodiment). Combining equations (1) and (4) for a fixed $\Delta I_2$ results in $$\Delta T_1 - \Delta T_2 = K \Delta I_1 [1 + (\Delta I_2/\Delta I_1) \cdot \exp(-\Delta t_1/t_{thermal}) - (\Delta I_2/\Delta I_1)\exp(-\Delta I_1 \Delta t_1/\Delta I_2 t_{thermal})]. \quad \text{Equation 6.}$$

And therefore, the constraint on allowable $\Delta I_1$ and $\Delta t_1$ values is given by $$\Delta I_1 [1 + (\Delta I_2/\Delta I_1) \cdot \exp(-\Delta t_1/t_{thermal}) - (\Delta I_2/\Delta I_1)\exp(-\Delta I_1 \Delta t_1/\Delta I_2 t_{thermal})] \leq K \Delta T_{tolerable}. \quad \text{Eq. 7}$$

Note that it is not necessary to know the value of the constant "K" because its reciprocal is embedded in $\Delta T_{tolerable}$.

Finally, the curve expressed by Equation 7 is not a simple form. It is simple to evaluate numerically. If it is desirable to have an approximation to the curve expressed by equation (7), one can assume that $\Delta t_1/t_{thermal} \ll 1$ and $\Delta t_2/t_{thermal} \ll 1$ (both often approximately true), and therefore derive $$\Delta I_1 [1 + (\Delta I_2/\Delta I_1) - (1 - \Delta t_1/t_{thermal}) - (\Delta I_2/\Delta I_1)(1 - \Delta I_1 \Delta t_1/\Delta I_2 t_{thermal})] \leq K \Delta T_{tolerable}, \quad \text{Eq. 8}$$

which simplifies to $$2 \Delta I_1 \Delta t_1/t_{thermal} < K \Delta T_{tolerable}. \quad \text{Eq. 9}$$

Since both K and $\Delta T_{tolerable}$ depend on the thermal properties of the laser diode, Equation 9 suggests that, as an approximation, the product of $\Delta I_1$ and $\Delta t_1$ must be less than or equal to some maximum value $C = \frac{1}{2} K t_{thermal} \Delta T_{tolerable}$, which depends on thermal properties associated with the laser diode. In short, Equation 9 may be rewritten as:

$$\Delta I_1 \Delta t_1 \leq C \quad \text{Equation 10}$$

Figure 3:
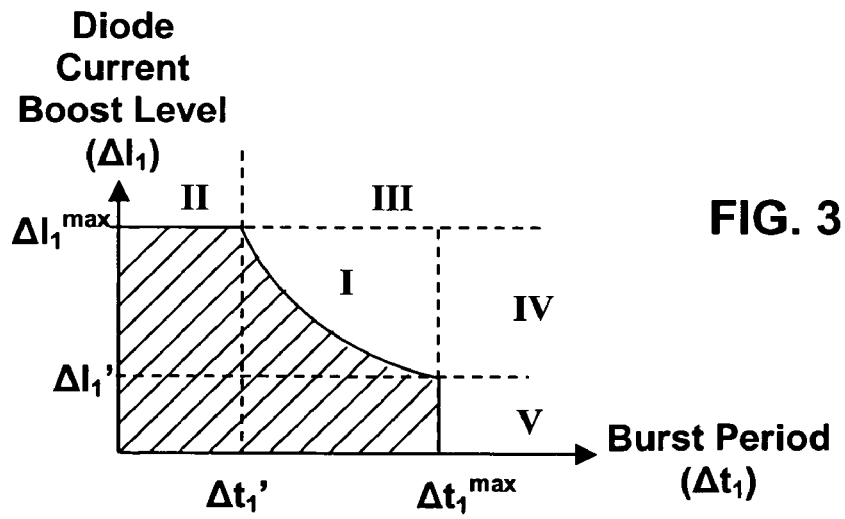
FIG. 3 is graph illustrating a relationship between the amount of boost in laser diode current and the time interval for the boost.

The values of $\Delta I_1^{max}$ and $\Delta t_1^{max}$ and the relationship between $\Delta I_1$ and $\Delta t_1$ may be determined experimentally for a given laser diode as described above to produce a graph like the one shown in FIG. 3. By way of example, allowed values of $\Delta I_1$ and $\Delta t_1$ may lie within the shaded portion of the graph, bounded by the curve and the values $\Delta I_1 = 0$, $\Delta I_1^{max}$, $\Delta t_1 = 0$, and $\Delta t_1 = \Delta t_1^{max}$. The point where the curve takes on the value of $I_1^{max}$ has a burst period value indicated as $\Delta t_1'$. Similarly, the boost level on the curve for the maximum burst period is indicated as $\Delta I_1'$. In general, if $\Delta I_1$ and $\Delta t_1$ are within the allowed range then there will exist a pair of allowable values for $\Delta I_2$ and $\Delta t_2$. More precisely, it is not meaningful to say that $\Delta I_1$ and $\Delta t_1$ are within the allowed range without also knowing the values of $\Delta I_2$ and $\Delta t_2$. However, the thermal equilibrium constraints tie $\Delta I_2$ and $\Delta t_2$ together, so that there is only one "degree of freedom" remaining. How that degree of freedom is selected (i.e. the tradeoff between $\Delta I_2$ and $\Delta t_2$) slightly impacts the boundary for allowable values of $\Delta I_1$ and $\Delta t_1$.

In this example, the curved portion of FIG. 3 may represent a mathematical relation in which a product of the time interval $\Delta t_1$ and the requested current increase $\Delta I_1^{req}$ is less than some constant value, e.g., about 20 amp-milliseconds. A similar mathematical relation, and corresponding graph may be developed to represent the mathematical relation between $\Delta I_2$ and $\Delta t_2$. Please note that the graph in FIG. 3 represents an approximation to the true constraints on $\Delta t_1$ and $\Delta t_2$ described by the model above. However, it is convenient to approximate the constraints in this way.

Once a value of $\Delta I_1$ is chosen, the corresponding value of $\Delta t_1$ may be determined from the graph. Although $\Delta I_2$ may take on any value between $I_{thresh}$ and $I_{nom}$ it is often convenient to set $\Delta I_2$ at some maximum allowable level $\Delta I_2^{max}$ that still places $I_2$ above $I_{thresh}$ so as to accomplish thermal equilibrium as quickly as possible. Then $\Delta t_2$ can be calculated from Equation 1, which may be rewritten as:

$$\Delta t_2 = \Delta I_1 \Delta t_1/\Delta I_2^{max} \quad \text{Equation 11:}$$

Figure 4A:
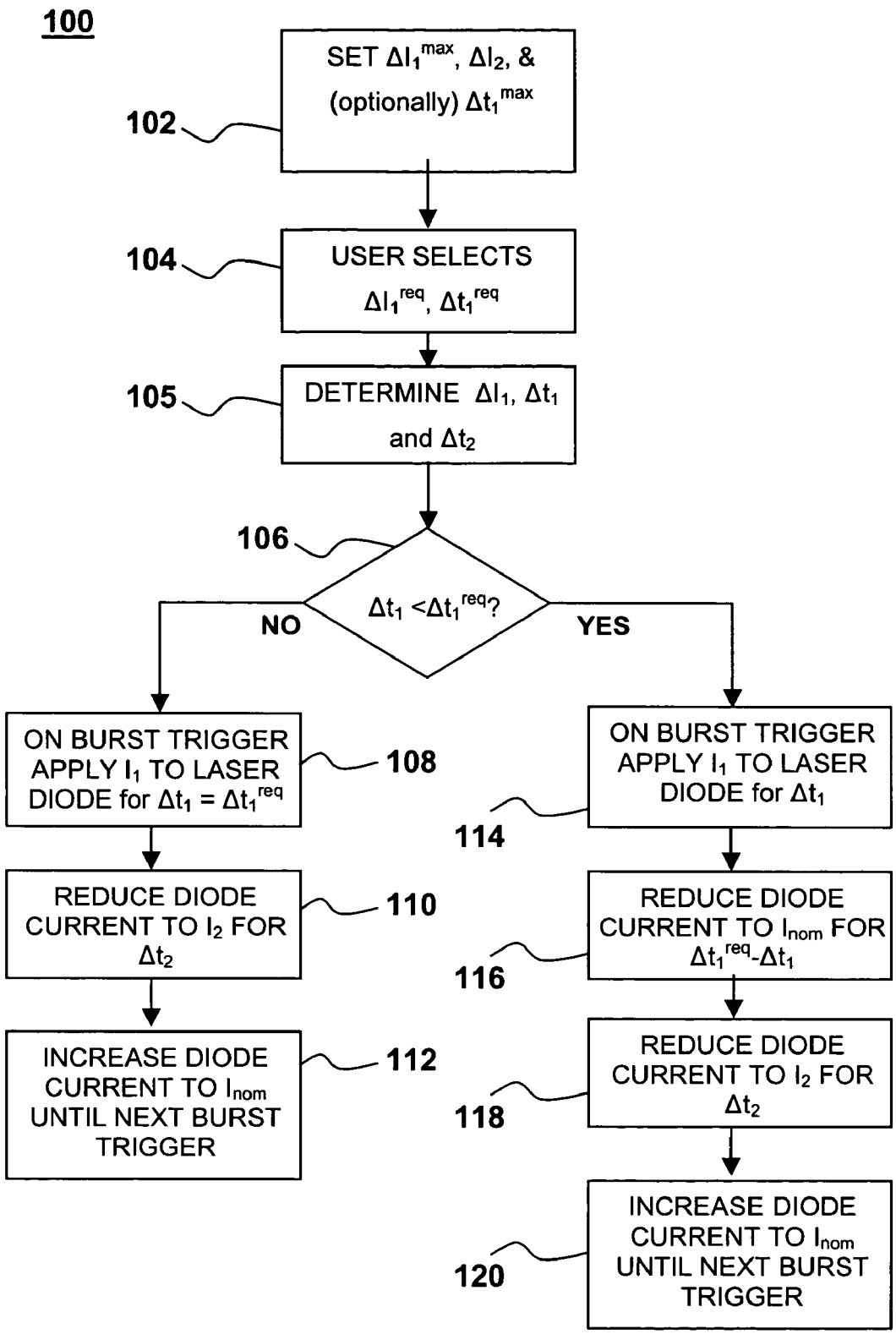
FIG. 4A is a flow diagram illustrating a method for pulsed operation of a diode pumped laser according to an embodiment of the present invention.
Figure 4B:
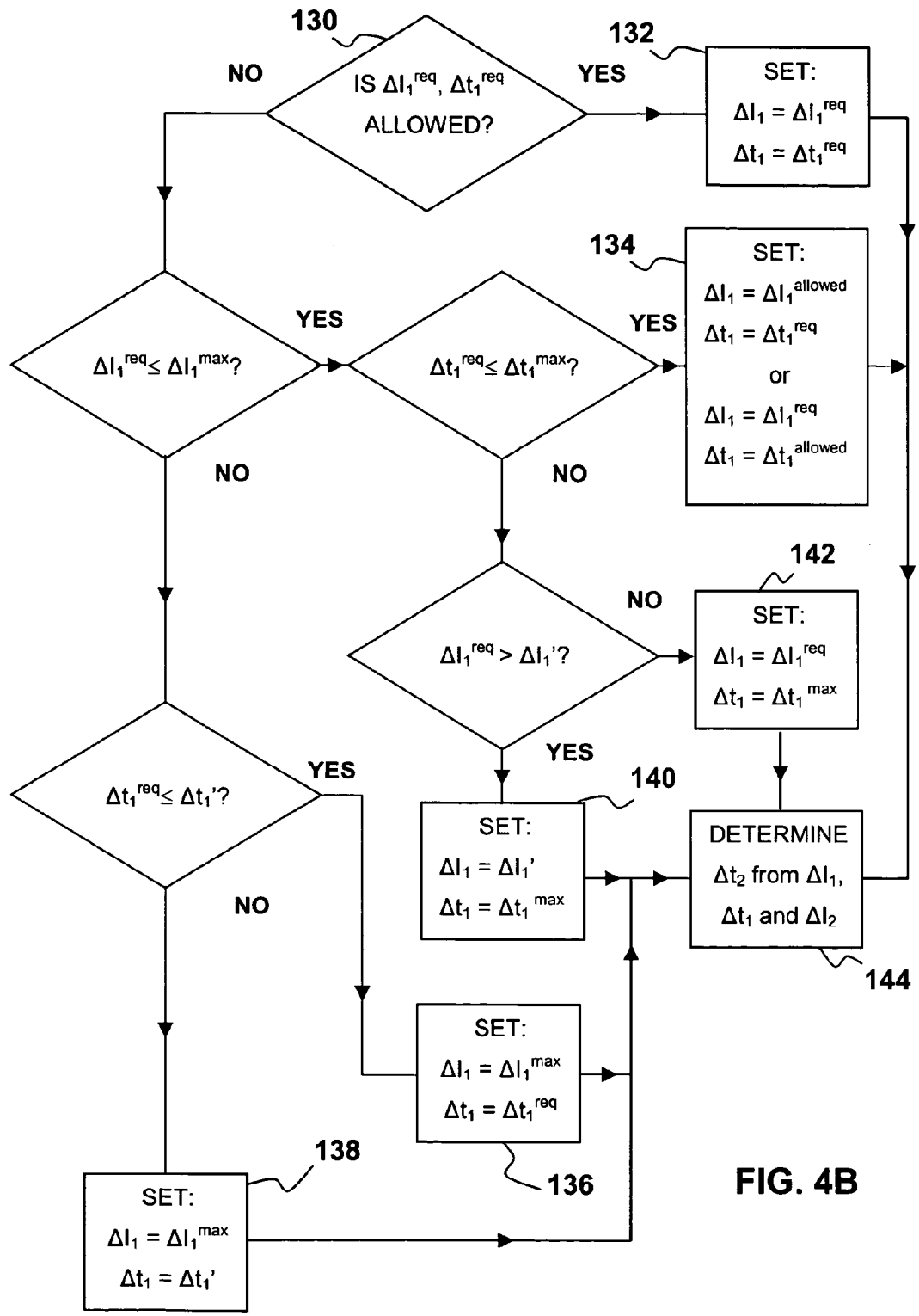
FIG. 4B is a flow diagram of a decision tree for determining actual values of a boost level $\Delta I_1$ and burst period $\Delta t_1$ from requested values $\Delta I_1^{req}$ and $\Delta t_1^{req}$.

Embodiments of the burst boosting method described above may be implemented, e.g., by a method 100 as shown in the flow diagram of FIG. 4A. The method 100 may begin at step 102 by setting the values of $\Delta I_1^{max}$, $\Delta I_2$, and (optionally) $\Delta t_1^{max}$ for a laser diode, e.g., as described above. By way of example, $\Delta I_2$ may be arbitrarily set to $\Delta I_2 max$ as described above. The laser designer or manufacturer typically sets these values. At step 104 a laser user may request a boost level $\Delta I_1^{req}$ and burst interval $\Delta t_1^{req}$. Since the requested boost level and burst period may not be allowed by the constraints described above, at step 105 the actual values of $\Delta I_1$, $\Delta t_1$, $\Delta I_2$ and $\Delta t_2$ may be determined from the requested values $\Delta I_1^{req}$ and $\Delta t_1^{req}$. For example, FIG. 4B depicts a flow diagram of a decision tree for determining the actual values $\Delta I_1$ and $\Delta t_1$ from the requested values $\Delta I_1^{req}$ and $\Delta t_1^{req}$. At step 130, it may be determined whether the combination of requested values $\Delta I_1^{req}$ and $\Delta t_{1req}$ is an allowable combination, e.g., if the combination lies within the allowed range indicated by the shaded region of the graph shown in FIG. 3. If this is so, then $\Delta I_1$ and $\Delta t_1$ may respectively be set to the requested values $\Delta I_1^{req}$ and $\Delta t_1^{req}$ as indicated at 132.

If the combination of $\Delta I_1^{req}$ and $\Delta t_1^{req}$ lies outside the shaded region then the actual values $\Delta I_1$ and $\Delta t_1$ depend on where outside the shaded region the requested combination lies. For example, if $\Delta I_1^{req} \leq \Delta I_1^{max}$ and $\Delta t^{req} \leq \Delta t_1^{max}$ (corresponding e.g., to region I of FIG. 3) an allowable combination may be obtained by either setting $\Delta t_1$ to $\Delta t_1^{req}$ and setting $\Delta I_1$ to an allowed value $\Delta I_1^{allowed}$ (e.g., a value for which the combination $\Delta I_1^{allowed}$, $\Delta t_1^{req}$ lies on the curve). Alternatively, and more preferably, an allowed combination may be obtained by setting $\Delta I_1$ to $\Delta I_1^{req}$ and setting or by setting $\Delta t_1$ to an allowed value $\Delta t_1^{allowed}$ (e.g., a value for which the combination $\Delta I_1^{req}$, $\Delta t_1^{allowed}$ lies on the curve). Both of these possibilities are indicated at 134. If $\Delta I_1^{req} > \Delta I_1^{max}$ and $\Delta t_1^{req} \leq \Delta t_1'$ (corresponding to region II of FIG. 3) an allowable combination may be obtained by setting $\Delta t_1$ equal to $\Delta t_1^{req}$ and setting $\Delta I_1$ to $\Delta I_1^{max}$ as indicated at 136. If $\Delta I_1^{req} > \Delta I_1^{max}$ and $\Delta t_1^{req} > \Delta t_1'$ (corresponding to region III of FIG. 3) an allowable combination may be obtained by setting $\Delta t_1$ equal to $\Delta t_1$ and setting $\Delta I_1$ to $\Delta I_1^{max}$ as indicated at 138. If $\Delta I_1^{req}$ is less than $\Delta I_1^{max}$ but greater than $\Delta I_1'$ and $\Delta t_1^{req} > \Delta t_1^{max}$ (corresponding to region IV of FIG. 3) an allowable combination may be obtained by setting $\Delta I_1$ equal to $\Delta I_1'$ and setting $\Delta t_1$ to $\Delta t_1^{max}$ as indicated at 140. If $\Delta I_1^{req} \leq \Delta I_1'$ and $\Delta t_1^{req} > \Delta t_1^{max}$ (corresponding to region V of FIG. 3) an allowable combination may be obtained by setting $\Delta I_1$ equal to $\Delta I_1^{req}$ and setting $\Delta t_1$ to $\Delta t_1^{max}$ as indicated at 142.

Independent of how one determines the values of $\Delta I_1$ and $\Delta t_1$, at step 144 the value of $\Delta t_2$ may be calculated from the values determined for $\Delta I_1$ and $\Delta t_1$ and the set value for $\Delta I_2$, e.g., using Equation 11. The laser may then operate in a burst boost mode.

At step 106, the value of $\Delta t_1$ determined above may be compared to the requested value $\Delta t_1^{req}$. If the actual value of $\Delta t_1$ is not less than the requested value $\Delta t_1^{req}$, the operation of the laser diode may proceed as follows. The nominal current $I_{nom}$ is applied to the laser diode until a burst signal triggers the start of a burst. At step 108, when the burst is triggered, the current increases by $\Delta I_1$ and a current of $I_1=(I_{nom}+\Delta I_1)$ is applied to the laser diode to boost the output of the laser diode for burst period $\Delta t_1=\Delta t_1^{req}$. After the burst period, the current is reduced step 110 to a value $I_2=(I_{nom}-\Delta I_2)$ for an interval $\Delta t_2$. Subsequently, at step 112 the diode current increases back to the nominal value $I_{nom}$ until the next burst is triggered.

If, at step 106 the actual value of the burst period $\Delta t_1$ is less than the requested value of the burst period $\Delta t_1^{req}$ the burst sequence is different. Specifically, at step 114, when the burst is triggered, the current increases by $\Delta I_1$ and a current of $I_1=(I_{nom}+\Delta I_1)$ is applied to the laser diode to boost the output of the laser diode for burst period $\Delta t_1$ (determined, e.g., as described above with respect to FIG. 4B). The current is subsequently reduced at step 116 to $I_{nom}$ for a period of time equal to $\Delta t_1^{req}-\Delta t_1$. Afterwards, the current is reduced at step 118 to a value $I_2=(I_{nom}-\Delta I_2)$ for an interval $\Delta t_2$. Subsequently, at step 120 the diode current increases back to the nominal value $I_{nom}$ until the next burst is triggered. This sequence allows for longer burst periods while keeping the thermal load on the laser diode within manageable levels.

Figure 5:
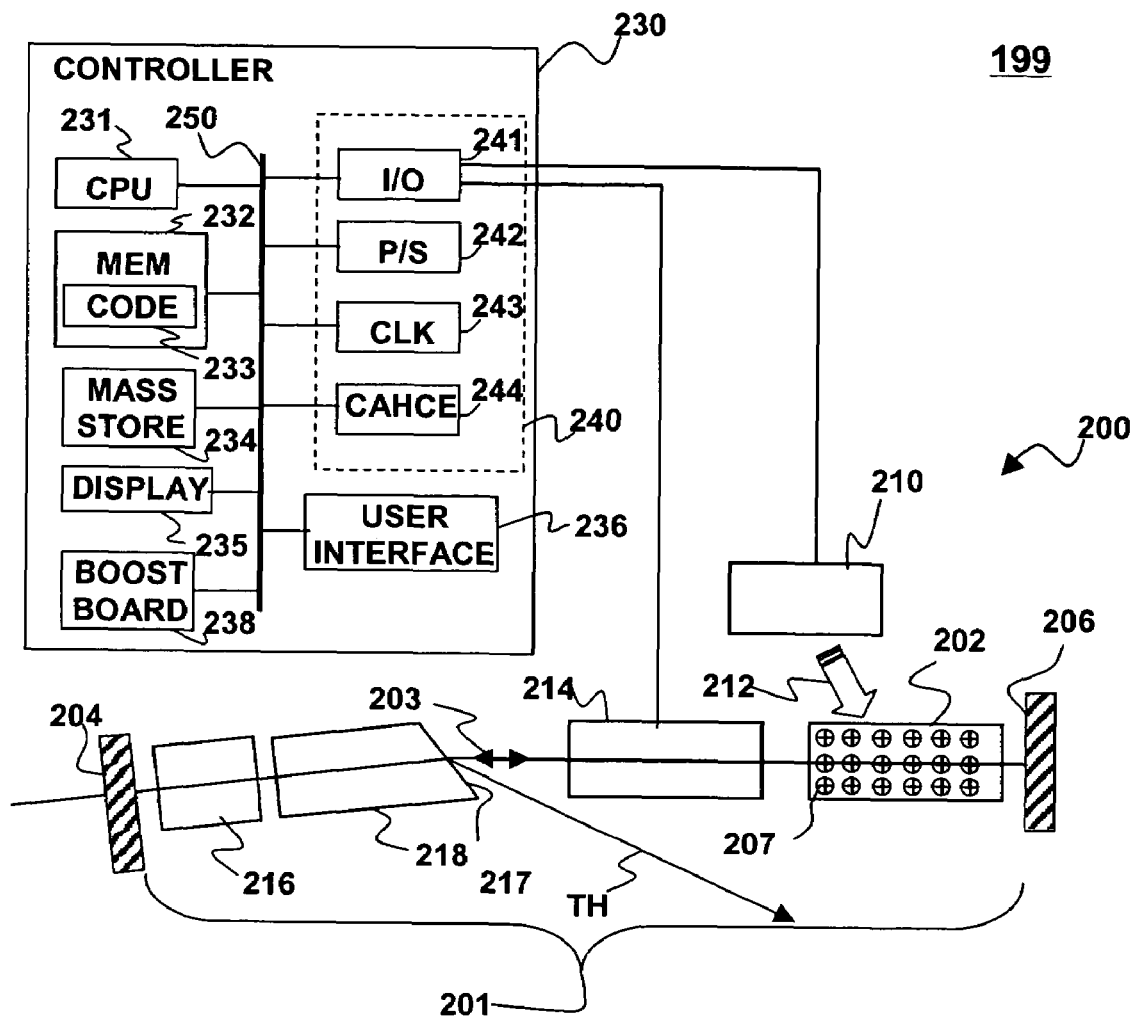
FIG. 5 is a schematic diagram of a laser apparatus according to an embodiment of the present invention.

FIG. 5 depicts an example of a laser apparatus 199 according to an embodiment of the present invention. The apparatus generally includes a laser 200 operable under signals from a controller 230. The laser 200 generally includes a gain medium 202 disposed within a cavity 201 defined by two or more reflecting surfaces 204, 206. The gain medium 202 may be doped with dopant ions 207 that provide a metastable state for lasing. The cavity 201 is configured to support fundamental electromagnetic radiation 203, e.g., stimulated radiation from the gain medium 202, characterized by a frequency ω chosen such that the radiation 203 falls within the infrared portion of the electromagnetic spectrum. In a preferred embodiment, the fundamental frequency ω corresponds to a vacuum wavelength of about 1064 nm. In alternative embodiments, the fundamental frequency ω can correspond to a vacuum wavelength of about 914 nm, 946 nm, 1047 nm, 1053 nm, 1319 nm or 1343 nm.

The gain medium 202 is preferably a solid-state material, such as a crystalline material or a glass. The gain medium 202 can have a length of between about 1 mm and about 200 mm if it is crystalline or bulk glass in nature. If the gain medium is a fiber, then it is typically much longer, from about 0.1 meters to several hundred meters. Preferable crystalline materials include oxides and fluoride crystals, such as yttrium lithium fluoride (YLF). Oxide crystals include YALO (YAlO$_3$), yttrium orthovanadate (YVO$_4$) and garnets. Suitable garnets include yttrium aluminum garnet (YAG), gadolinium gallium garnet (GGG), gadolinium scandium gallium garnet (GSGG), and yttrium scandium gallium garnet (YSGG). A preferred garnet is YAG, which can be doped with different ions. Preferred doped YAG crystals include Tm:Ho:YAG, Yb:YAG, Er:YAG and Nd:YAG. Other preferred laser gain media include Nd:YVO$_4$ and Nd:YALO.

By way of example, and without limitation, the gain medium 202 may be Yttrium Aluminum Garnet (YAG) doped with Nd$^{3+}$ dopant ions 207 (Nd$^{3+}$:YAG). By way of example, the gain medium 202 may be a Nd-YAG Brewster rod having a 1% Nd-dopant level. Nd$^{3+}$:YAG produces stimulated emission at vacuum wavelengths of about 946 nm, about 1064 nm, and about 1319 nm, among others. Other suitable gain media include, those listed above, which may be of various shapes and sizes and with higher or lower co-dopant levels. Nd:YAG and other gain media are commercially available, e.g., from VLOC of New Port Richey, Fla. and numerous other companies.

The gain medium 202 may have two end surfaces through which the fundamental radiation 203 passes. The end surfaces of the gain medium 202 may be normal (perpendicular) or near normal to the direction of propagation of the fundamental radiation 203 as shown in FIG. 5. Alternatively, the end surfaces may be situated at a Brewster's angle $\theta_B$ relative to the fundamental radiation 203, such that the fundamental radiation 203 is p-polarized with respect to the end surfaces, i.e. polarized in the plane of the plane of incidence of the fundamental radiation 203. Alternatively, end surfaces may be polished at some other angle.

The gain medium 202 is pumped (e.g., end-pumped or side-pumped) by one or more sources 210 of pumping energy 212. An interaction between the pumping energy 212 and the gain medium 202 produces the radiation 203. The pumping energy 212 may be in the form of radiation introduced through one or more sides and/or ends of the gain medium 202. The radiation may have a vacuum wavelength ranging from about 650 nm to about 1550 nm. For Nd:YAG, the pumping radiation is typically at a vacuum wavelength of about 808 nm or about 880 nm. The sources 210 may include one or more laser diodes. By way of example, suitable laser diodes are available, e.g., from Spectra Physics, of Mountain View, Calif. and other companies.

To pulse the gain medium in the manner described above, the pumping energy sources 210 may operate in response to signals from the controller 230. The controller 230 may include a central processor unit (CPU) 231 and a memory 232 (e.g., RAM, DRAM, ROM, and the like). The controller 230 may also include well-known support circuits 240, such as input/output (I/O) circuits 241, power supplies (P/S) 242, a clock (CLK) 243 and cache 244. The controller 230 may optionally include a mass storage device 234 such as a disk drive, CD-ROM drive, tape drive, or the like to store programs and/or data. The controller may also optionally include a display unit 235 and user interface unit 236 to facilitate interaction between the controller 230 and a user. The display unit 235 may be in the form of a cathode ray tube (CRT) or flat panel screen that displays text, numerals, or graphical symbols. The user interface 236 may include a keyboard, mouse, joystick, light pen or other device. The preceding components may exchange signals with each other via a system bus 250.

In embodiments where the pumping energy sources 210 include one or more laser diodes, electric currents applied to the laser diodes controls the level of pumping energy 212 in the form of radiation from the laser diode. The controller 230 may include a specially configured boost circuit 238 that drives the current to the laser diodes in the pulsed fashion described herein. The boost circuit 238 may be coupled to the laser diode either directly or through the I/O circuits 241 coupled to the system bus 250.

Figure 6:
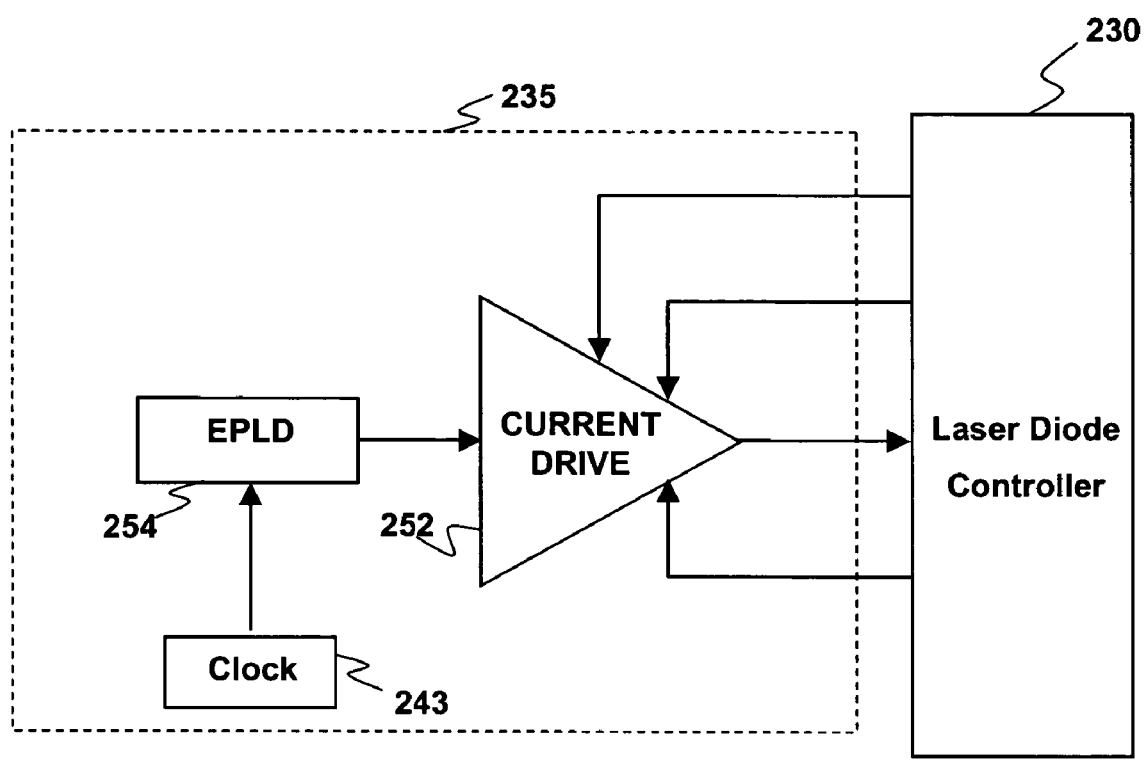
FIG. 6 is a block diagram illustrating a laser diode boost circuit according to an embodiment of the present invention.

FIG. 6 depicts an example one possible configuration, among others for boost circuit 238. In this example, the boost circuit 238 includes a current drive unit 252, a clock 243, and an electronically programmable logic device (EPLD). 254 (e.g., an Altera EPM7128 from Altera Corporation of San Jose, Calif.). In this example, the computation of integration, its limits, and current reduction time are performed in the EPLD 254. The clock 243 serves a time base for the integration and timing operations. The current drive unit 252 consisting of common electronic parts provides signals to the laser diode controller 230 for adjustment of the diode current.

The CPU 231 and other elements of the controller 230 and signal generator 200 may be coupled to each other via a system bus 250 as shown in FIG. 2. In particular the tuning controllers 204, 205, DDS 223, PLL 224, and integration 225 may be coupled to the controller 230 via the I/O circuits 241. The controller 230 typically operates the pumping energy sources 210 through the I/O circuits 241 in response to data and program code instructions 233 stored and retrieved by the memory 232 and executed by the processor 231. The program code instructions 233 may implement pulsing of the pumping energy 212 applied to the gain medium 202 in such a way as to maintain a substantially steady long-term thermal load as described above. The code 233 may conform to any one of a number of different programming languages such as Assembly, C++, JAVA or a number of other languages. The CPU 231 forms a general-purpose computer that becomes a specific purpose computer when executing programs such as the program code 233. Although the program code 233 is described herein as being implemented in software and executed upon a general purpose computer, those skilled in the art will realize that the method of pulsed pumping could alternatively be implemented using hardware such as an application specific integrated circuit (ASIC) or other hardware circuitry. As such, it should be understood that embodiments of the invention can be implemented, in whole or in part, in software, hardware or some combination of both. In one embodiment, among others, the program code 233 may include a set of processor readable instructions that implement a method having features in common with the method 100 of FIG. 4.

The cavity 201 may be configured, e.g., by choosing the dimensions (e.g. radii), reflectivities and spacing of the reflectors 204, 206 such that the cavity 201 is a resonator capable of supporting radiation of the fundamental frequency Co. Although a cavity 201, having two reflecting surfaces is depicted in FIG. 5, those of skill in the art will be able to devise other cavities, e.g., having stable, unstable, 3-mirror, 4-mirror Z-shaped, 5-mirror W-shaped, cavities with more legs, ring-shaped, linear or bowtie configurations being but a few of many possible examples. One of the reflectors 204, 206 may be partially reflecting so that the fundamental radiation 203 can escape from the cavity 201.

The laser 200 may optionally include a pulsing mechanism 214 that facilitates generation of high-intensity radiation pulses (e.g. a Q-switch, a modelocker, passive saturable absorber, a gain control device or some combination thereof). In particular embodiments the pulsing mechanism is a Q-switch. The Q-switch may be an active Q-switch (e.g., using an electro-optic or acousto-optic modulator coupled to the controller 230), or a passive Q-switch (e.g., using a saturable absorber). The pulsing mechanism may pulse the radiation 203 in response to signals from the controller 230 during time intervals when increased current is applied to the pumping energy source 210.

Other variations on the laser of FIG. 5 include lasers that contain more than one section of gain medium, more than one type of gain medium, or use non-linear materials (e.g., lithium niobate, lithium borate (LBO) and the like, to frequency convert the radiation 203. Non-linear materials may optionally be used, e.g., for generation of higher or lower harmonics of the fundamental radiation 203. Such non-linear materials may be located within the cavity 201 or outside the cavity 201. By way of example, the pump radiation 212 may stimulate emission by the gain medium 202 of fundamental radiation 203 having frequency co, corresponding e.g., to a wavelength of about 1064 nm. In the example depicted in FIG. 5, the laser 200 may optionally further include first and second non-linear elements 216, 218, e.g., non-linear crystals such as lithium borate, (LBO), disposed within the cavity 201. The first non-linear element 216 may be phase-matched for second harmonic generation, to convert a portion of the fundamental radiation to 203 radiation of frequency 2ω, corresponding, e.g., to a vacuum wavelength of about 532 nm. The second non-linear element 218 is phase-matched for sum frequency generation between the fundamental radiation and the second harmonic radiation to produce third harmonic radiation TH of frequency 3ω, corresponding, e.g., to a wavelength of about 355 nm. The second non-linear element 218 may include a Brewster-cut face 217. Third harmonic radiation TH emerging from the second non-linear element through the Brewster-cut face 217 refracts out of the cavity 201 as output radiation from the laser. Fundamental radiation 203 may remain within the cavity 201 to participate in additional frequency conversion. Third-harmonic generating lasers are described in detail, e.g., in commonly-assigned U.S. Pat. No. 5,850,407, which is incorporated herein by reference. Higher harmonics can be generated from the fundamental radiation 203, e.g., fourth-harmonics of 1064-nm radiation having a vacuum wavelength of 266 nm. Fourth-harmonic generating lasers are described, e.g., in commonly-assigned U.S. Pat. No. 6,697,391.

Figure 7A:
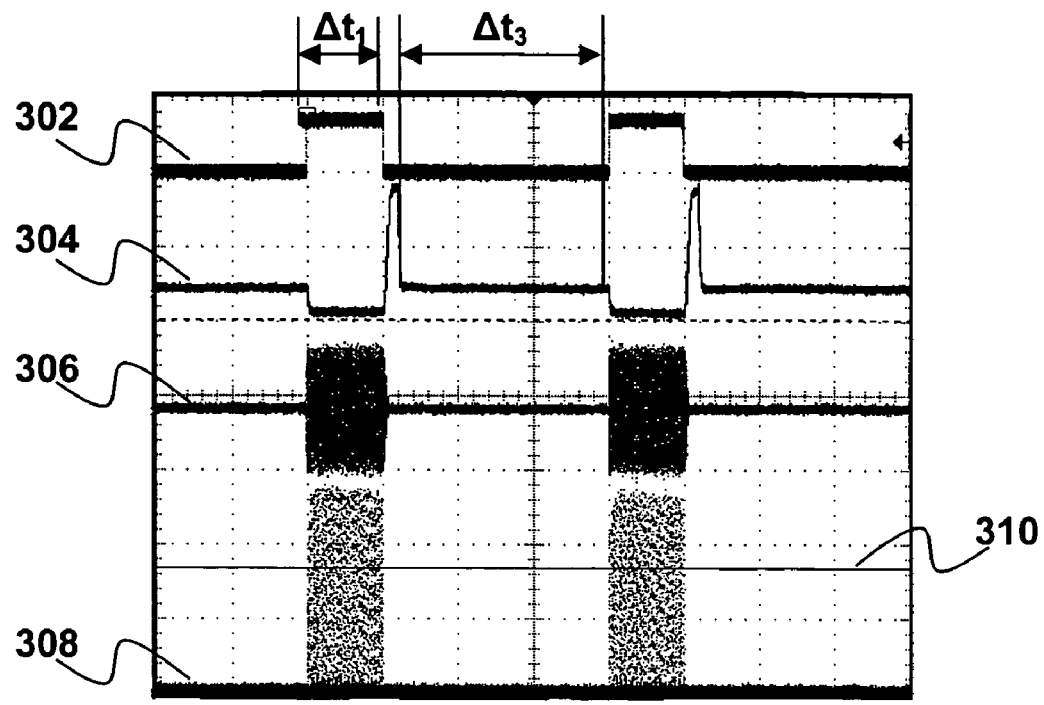
FIGS. 7A-7B are graphs of oscilloscope traces illustrating pulsed operation of laser diodes according to embodiments of the present invention.
Figure 7B:
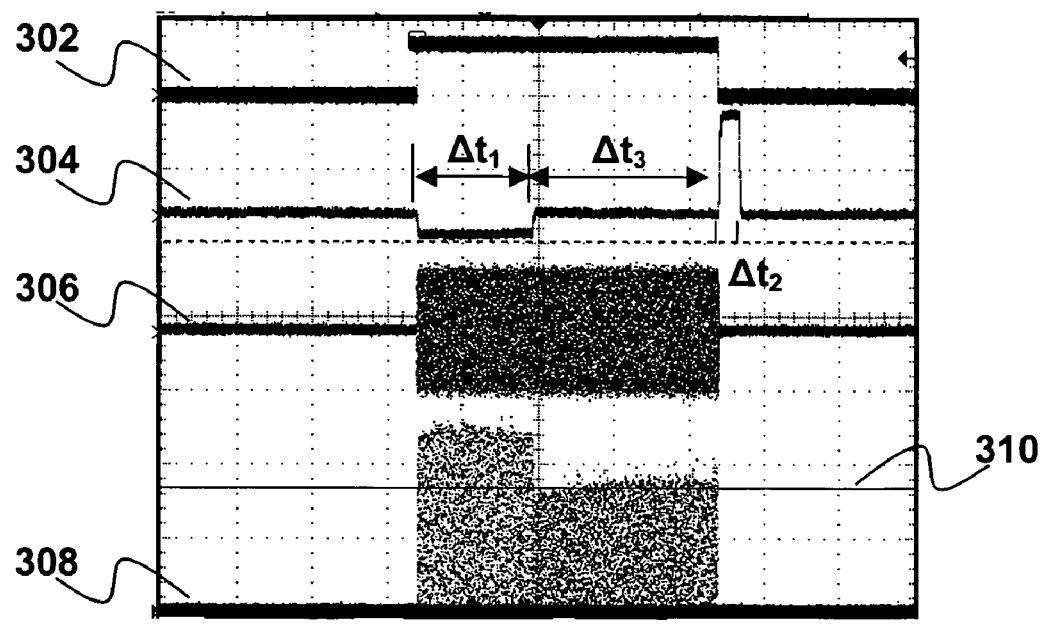

The inventor has implemented a laser burst boosting method of the type shown in FIG. 4 using a laser apparatus of the type depicted in FIG. 5 and FIG. 6. FIGS. 7A-7B are oscilloscope traces illustrating operation of the laser apparatus in accordance with the method. Specifically, FIGS. 7A-7B show traces indicating a boost detect signal 302 from the EPLD, a diode current 304, a radiofrequency signal 306 that drives an acousto-optic modulator used in the switching device and an optical output 308 (in this case ultraviolet) from the laser that the diode is pumping. With respect to the optical output 308, the horizontal line indicated as 310 shows the unboosted level. In both FIG. 7A and FIG. 7B, the polarity of the diode current trace 304 is negative, i.e., portions of the traces that are higher on the graph indicate a reduced current. In this example, the laser was a model Q303 from Lightwave Electronics of Mountain View, Calif. The laser was pumped by three 40 Watt 808-nm laser diodes, operated near 40 amps nominal current $I_{nom}$, with up to about 10 amps of boost current $\Delta I_1$, and about 20 amps of reduction current $\Delta I_2$. In FIG. 7A, the current reduction $\Delta I_2$ was a fixed value and the reduction time $\Delta t_2$ was calculated from Equation 1. The integral of $\Delta I_1$ over the burst interval was below the maximum value. Note that the current reduced to $I_2$ after $\Delta t_1$, then returned to $I_{nom}$. Note also that during $\Delta t_1$, the RF signal was applied to the AO modulator to Q-switch the laser leading to increased laser output during $\Delta t_1$.

In FIG. 7B, the current reduction $\Delta I_2$ was a fixed value and the reduction time $\Delta t_2$ was calculated from Equation 1. The integral of $\Delta I_1$ over the burst interval exceeded the maximum value after $\Delta t_1$. This triggered a reduction of the diode current to $I_{nom}$ for the rest of the burst period. Note that the current reduced to $I_2$ at the end of the burst period, then returned to $I_{nom}$. During the burst period, the RF signal was applied to the AO modulator to Q-switch the laser during the burst period. Note that the drop in laser output to the unboosted level 310 corresponding to the reduction in the diode current to $I_{nom}$.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. In the claims that follow, the indefinite article "A" or "An" refers to a quantity of one or more of the item following the article, except where expressly stated otherwise. The appended claims are not to be interpreted as including means-plus-function or step-plus-function limitations, unless such a limitation is explicitly recited in a given claim using the phrase "means for" or "step for."

What is claimed is:

1. A method for controlling heat loading of a laser gain medium, comprising the steps of: applying a burst of energy to the laser gain medium, by applying a pulse of pumping power to the gain medium with one or more sources of pumping energy, wherein the burst of energy heats the gain medium; and
   underheating the laser gain medium sufficiently to bring a thermal condition on the laser gain medium to a predetermined substantially steady state by reducing the pumping power applied to the gain medium below a steady state power before applying a subsequent burst of heat to the laser gain medium,
   wherein the steps of applying a burst of energy to the laser gain medium and underheating the laser gain medium are performed by: applying a pulse of current at a first current level $I_1$ to a laser diode coupled to the gain medium for a first time interval $\Delta t_1$, where $I_1$ exceeds a nominal current value $I_{nom}$ by an amount $\Delta t_1$;
   reducing the current to the laser diode to a second current level $I_2$ for a second time interval $\Delta t_2$, where $I_{nom}$ exceeds $I_2$ by an amount $\Delta I_2$; and
   after applying the pulse of current at the first current level $I_1$, and before or after reducing the current to the second level $I_2$, applying the nominal current to the laser diode for a third time interval $\Delta t_3$ before applying another pulse of current to the laser diode.

2. The method of claim 1 wherein $I_2$ is greater than a threshold current for lasing in the laser diode.

3. The method of claim 1, further comprising, the step of determining an allowable range for pairs of values of $\Delta I_1$ and $\Delta t_1$, wherein the allowable range depends, at least partly, on thermal properties associated with the laser diode.

4. The method of claim 3 wherein the range of allowed values for $\Delta I_1$ and $\Delta t_1$ is such that, for the allowable range, $\Delta I_1 \Delta t_1 \leq C$, where the value of C depends on the thermal properties associated with the laser diode.

5. The method of claim 3 wherein, for a requested value of $\Delta I_1$, a requested value of $\Delta t_1$ lies within the range of allowed values, the step of applying the nominal current takes place before the step of applying the current $I_2$.

6. The method of claim 3 wherein, for a requested value of $\Delta I_1$ a requested value of $\Delta t_1$ lies outside the range of allowed values, the step of applying the nominal current takes place after the step of applying the current $I_2$.

7. The method of claim 6 wherein the value of the first time interval $\Delta t_1$ is equal to an allowed value of $\Delta t_1$ for the requested value of $\Delta I_1$.

8. The method of claim 1 wherein $\Delta t_1$, $\Delta t_2$ and $\Delta t_3$ are such that average thermal loads on the laser diode and gain medium are substantially independent of a duty cycle determined from $\Delta t_1$ and the sum of $\Delta t_2$ and $\Delta t_3$.

9. The method of claim 8 wherein an integral of $\Delta I_1$ over the time $\Delta t_1$ is approximately equal in magnitude to an integral of $\Delta I_2$ over the time $\Delta t_2$.

10. The method of claim 1 wherein the diode pumped laser is a fundamental laser wherein the gain medium is disposed along an optical path between two or more reflecting surfaces.

11. The method of claim 1 wherein the diode pumped laser is an intracavity frequency converted laser wherein the gain medium and one or more frequency converting elements are disposed along an optical path between two or more reflecting surfaces.

12. The method of claim 1 wherein the gain medium is doped YAG, YLF, $YVO_4$, or $YAlO_3$.

13. The method of claim 1 wherein the gain medium produces a fundamental radiation in response to pumping radiation from the laser diode.

14. The method of claim 1 wherein harmonics of the fundamental radiation include 532 nm, 355 nm and 266 nm radiation.

15. The method of claim 1, further comprising Q-switching a laser output of the gain medium during time $\Delta t_1$ to produce two or more pulses of output laser radiation.

16. The method of claim 15 in which the Q-switching generates laser pulses at a repetition rate of greater than 10 kHz.

17. A laser apparatus, comprising:
   a resonant cavity defined by two or more reflectors;
   a gain medium disposed within an optical cavity along an optical path between the two or more reflectors;
   a laser diode optically coupled to the gain medium to provide pumping radiation to the gain medium when an electric current is applied to the laser diode; and
   a controller coupled to the laser diode, wherein the controller regulates the electric current applied to the diode such that the controller applies a pulse of current at a first current level $I_1$ to the laser diode for a first time interval $\Delta t_1$, reducing the current to the laser diode to a second current level $I_2$ for a second time interval $\Delta t_2$, and
   after applying the pulse of current at the first current level $I_1$, and before or after reducing the current to the second level $I_2$, the controller applies a nominal current $I_{nom}$ to the laser diode for a third time interval $\Delta t_3$ before applying another pulse of current to the laser diode,
   wherein $I_1$ exceeds $I_{nom}$ by an amount $\Delta I_1$,
   wherein $I_{nom}$ exceeds $I_2$ by an amount $\Delta I_2$.

18. The apparatus of claim 17 wherein an integral of $\Delta I_1$ over the time $\Delta t_1$ is approximately equal in magnitude to an integral of $\Delta I_2$ over the time $\Delta t_2$.

19. The apparatus of claim 18 wherein the controller can determine whether pairs of requested values of $\Delta I_1$ and $\Delta t_1$ are within a range of allowed values that depends, at least partly, on thermal properties associated with the laser diode.

20. The apparatus of claim 17, further comprising one or more non-linear materials disposed within the optical cavity along the optical path.

21. The apparatus of claim 20 wherein the one or more non-linear materials are configured to frequency convert a fundamental radiation from the gain medium.

22. The apparatus of claim 17 further comprising a Q-switch disposed within the optical cavity along the optical path.

23. The apparatus of claim 22 wherein the Q-switch is coupled to the controller such that the Q-switch pulses an output laser radiation from the optical cavity during the first time interval $\Delta t_1$ in response to one or more signals from the controller.

24. The apparatus of claim 23 in which the Q-switch generates laser pulses at a repetition rate of greater than 10 kHz.

25. The apparatus of claim 17 wherein the gain medium is doped YAC, YLF, YVO$_4$, or YAlO$_3$.

26. A laser apparatus, comprising:
- a resonant cavity defined by two or more reflectors;
- a gain medium disposed within an optical cavity along an optical path between the two or more reflectors;
- a laser diode optically coupled to the gain medium to provide pumping radiation to the gain medium when an electric current is applied to the laser gain medium; and
- means for applying a burst of energy to the laser gain medium, wherein the burst of energy heats the gain medium;
- means for underheating the gain medium sufficiently to bring a thermal condition on the laser gain medium to a predetermined substantially steady state before applying a subsequent burst of heat to the laser gain medium, wherein the means for applying the burst of energy to the laser gain medium and means for underheating comprise a controller having one or more electronic circuits configured such that, when, coupled to the laser diode, the controller regulates the electric current applied to the diode such that, upon a trigger signal, the controller applies a pulse of current at a first current level $I_1$ to the laser diode for a first time interval $\Delta t_1$, reducing the current to the laser diode to a second current level $I_2$ for a second time interval $\Delta t_2$, and
- after applying the pulse of current at the first current level $I_1$, and before or after reducing the current to the second level $I_2$, applying a nominal current $I_{nom}$ to the laser diode for a third time interval $\Delta t_3$ before applying another pulse of current to the laser diode,
- wherein $I_1$ exceeds $I_{nom}$ by an amount $\Delta I_1$,
- wherein $I_{nom}$ exceeds $I_2$ by an amount $\Delta I_2$.

27. The laser apparatus as defined in claim 26, wherein an integral of $\Delta I_1$ over the time $\Delta t_1$ is approximately equal in magnitude to an integral of $\Delta I_2$ over the time $\Delta t_2$.

28. The laser apparatus as defined in claim 27, wherein the controller is operative to determine whether pairs of requested values of $\Delta I_1$ and $\Delta t_1$ are within a range of allowed values that depends, at least partly, on thermal properties associated with the laser diode.

* * * * *

UNITED STATES PATENT AND TRADEMARK OFFICE
CERTIFICATE OF CORRECTION

| | | |
|---|---|---|
| PATENT NO. | : 7,352,784 B2 | Page 1 of 1 |
| APPLICATION NO. | : 10/896641 | |
| DATED | : April 1, 2008 | |
| INVENTOR(S) | : Adams et al. | |

It is certified that error appears in the above-identified patent and that said Letters Patent is hereby corrected as shown below:

Col. 1, line 46, "SUMMARY OF TH INVENTION" should read -- SUMMARY OF THE INVENTION --

Col. 19, line 5, "is doped YAC, YLF," should read -- is doped YAG, YLF, --

Signed and Sealed this

Twenty-second Day of July, 2008

JON W. DUDAS
*Director of the United States Patent and Trademark Office*